United States Patent
Shen et al.

[19]

[11] Patent Number: 6,143,474

[45] Date of Patent: *Nov. 7, 2000

[54] METHOD OF FABRICATING POLYSILICON STRUCTURES WITH DIFFERENT RESISTANCE VALUES FOR GATE ELECTRODES, RESISTORS, AND CAPACITOR PLATES

[75] Inventors: Chih-Heng Shen, Hsin-chu; Sen-Fu Chen, Taipei; Huan-Wen Wang; Ying-Tzu Yen, both of Hsin-Chu, all of Taiwan

[73] Assignee: Taiwan Semiconductor Manufacturing Company, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/073,950

[22] Filed: May 7, 1998

[51] Int. Cl.[7] ...................................................... G03F 7/00
[52] U.S. Cl. .......................... 430/313; 430/316; 438/383
[58] Field of Search .................................... 430/313, 314, 430/316; 438/45, 210, 238, 383, 384, 385, 532, 658, 659; 257/380

[56] References Cited

U.S. PATENT DOCUMENTS

| | | | |
|---|---|---|---|
| 4,643,777 | 2/1987 | Maeda | 148/1.5 |
| 5,141,597 | 8/1992 | Adams et al. | 156/628 |
| 5,514,617 | 5/1996 | Liu | 437/60 |
| 5,622,884 | 4/1997 | Liu | 438/238 |
| 5,705,418 | 1/1998 | Liu | 437/46 |

*Primary Examiner*—Kathleen Duda
*Attorney, Agent, or Firm*—George O. Saile; Stephen B. Ackerman; Graham S. Jones, II

[57] ABSTRACT

This method forms structures with different resistance values from a single polysilicon film formed on a substrate. Form a hard masking layer on the polysilicon film. Form a photoresist mask over the hard masking layer. Partially etch the hard masking layer through the photoresist mask to reduce the thickness of the polysilicon while leaving the remainder of the hard masking layer with the original thickness. The thickness is reduced in locations where a low resistance is to be located in the polysilicon film. Then dope the polysilicon layer through the hard masking layer with variable doping as a function of the reduced thickness and the original thickness of the hard masking layer.

19 Claims, 12 Drawing Sheets

METHOD OF FABRICATING POLYSILICON STRUCTURES WITH DIFFERENT RESISTANCE VALUES FOR GATE ELECTRODES, RESISTORS, AND CAPACITOR PLATES

BACKGROUND OF THE INVENTION

1. Field of the Invention

This invention relates to integrated circuit devices and more particularly to the process of manufacture of polysilicon structures with varying values of resistance and the devices produced by the process.

2. Description of Related Art

U.S. Pat. No. 5,705,418 of Liu for "Process for Fabricating Reduced-Thickness High-Resistance Load Resistors in Four-Transistor SRAM Devices" shows a method of forming polysilicon resistors where an oxide layer is used as an Ion Implantation (I/I) block. An oxidation resistant layer is formed and patterned for exposing regions of the polysilicon layer designated for the formation of the load resistors. An oxide layer is formed over the surface of the exposed portions of the polysilicon layer, so that the thickness of the designated regions of the polysilicon layer below the oxide layer is reduced. These designated regions are provided to form load resistors. The oxidation resistant layer is then removed. Then, impurity ions are implanted into exposed regions of the polysilicon layer, not covered by the oxide layer, which are designated for forming interconnectors for the memory cell unit.

U.S. Pat. No. 5,514,617 of Liu for "Method of Making a Variable Resistance Polysilicon Conductor for SRAM Devices" shows how to produce resistors using a patterning method with an ion implanation (I/I) process with step areas where variable doping results with higher resistance in the steeper areas than the flat areas, plus heavy doping formed in contact areas by doping through openings in a contact mask.

U.S. Pat. No. 4,643,777 of Maeda for "Method of Manufacturing a Semiconductor Device Comprising Resistors of High and Low Resistances" describes a method of forming resistors in portions of a polysilicon layer with portions covered with mask and the other portions covered with a molybdenum film. Then the molybdenum film is subjected to a silicifying step. The result is that those regions of the polysilicon film located under the molybdenum film have a low resistance, while the regions of the polysilicon film covered by the mask have a high resistance value.

See U.S. Pat. No. 5,622,884 of Liu for "Method for Manufacturing a Semiconductor Memory Cell and a Polysilicon Load Resistor of the Semiconductor Memory Cell" describe a load resistor formed by depositing a polysilicon layer over an insulating layer. The polysilicon layer is ion implanted with dopant and is then masked and etched to form a high resistance load resistor.

In the past, in order to form polysilicon layers with a different resistance in an integrated circuit, the solution has been to modify the area and length of the polysilicon to meet the criteria required. However, that approach increases the cost of manufacturing due to the complex process.

SUMMARY OF THE INVENTION

The invention shows a method of producing variable resistance resistors by using photolithography processes (masking and etching) to form different thicknesses of a hard masking layer (composed of silicon oxide/silicon nitride) over a polysilicon layer. Then ions are implanted through the hard masking layer to dope the resistor. A key point is that there are different thicknesses of the hard masking layer.

Several problems are solved by this invention, as follows:
1. One time doping (implantation) can provide different values of polysilicon resistance.
2. Controlled dosage can be achieved using different thicknesses of silicon dioxide or silicon nitride while doping.
3. Contamination is eliminated by using a hard mask (silicon oxide or silicon nitride) while doping.

The processing steps include the features, as follows:
1. Produce different polysilicon resistance using a single doping (implantation).
2. Different thickness of silicon oxide or silicon nitride over polysilicon are provided to control the dosage of doping (implantation).
3. Silicon dioxide or silicon nitride can prevent contamination of the polysilicon while doping.
4. The silicon dioxide or silicon nitride hard mask can be used for both polysilicon doping and additional step of polysilicon etching. The doping step can be before or after the etching step.

In accordance with this invention, a method is provided for forming a plurality of structures with different resistance values in a single photoresist film comprising:

forming a polysilicon layer upon a substrate, forming a hard masking layer upon the polysilicon layer with an original thickness, patterning the hard masking layer to expose a low resistance thereof, partially etching through the low resistance of the hard masking layer to produce a reduced thickness thereof while leaving the remainder of the hard masking layer with the original thickness, and doping the polysilicon layer through the hard masking layer with variable doping as a function of the reduced thickness and the original thickness of the hard masking layer.

Preferably, a patterning mask is formed over the hard masking layer after doping of the polysilicon layer, and then the hard mask and the polysilicon layer are patterned by the patterning mask.

Preferably, a patterning mask is formed over the hard masking layer before doping of the polysilicon layer, and then the hard mask and the polysilicon layer are patterned by the patterning mask, before doping of the polysilicon layer.

Preferably, the hard masking layer is composed of a material selected from the group consisting of silicon oxide and silicon nitride, and a patterning mask is formed over the hard masking layer before doping of the polysilicon layer.

Preferably, the hard masking layer is composed of a material selected from the group consisting of silicon oxide and silicon nitride, a patterning mask is formed over the hard masking layer after doping of the polysilicon layer, and then the hard mask and the polysilicon layer are patterned by the patterning mask.

Preferably, the hard masking layer is composed of a material selected from the group consisting of silicon oxide and silicon nitride.

A patterning mask is formed over the hard masking layer before doping of the polysilicon layer.

Then the hard mask and the polysilicon layer are patterned by the patterning mask before doping.

Preferably, the hard masking layer is composed of a material selected from the group consisting of silicon oxide and silicon nitride.

A patterning mask is formed over the hard masking layer before doping of the polysilicon layer, and Then the hard mask and the polysilicon layer are patterned by the patterning mask after doping.

Preferably, the full thickness portion is from about 0.3 μm to about 0.5 μm thick, and the lower thickness portion is from about 0.01 μm to about 0.15 μm thick.

BRIEF DESCRIPTION OF THE DRAWINGS

The foregoing and other aspects and advantages of this invention are explained and described below with reference to the accompanying drawings, in which.

DESCRIPTION OF PREFERRED EMBODIMENTS

The object of the method of this invention is to produce a set of high and low resistance polysilicon structures in an integrated circuit device.

There are numerous alternative sequences of processing steps which can be performed to produce the result seen in FIG. 1G.

First Embodiment of the Invention

Figure 1:
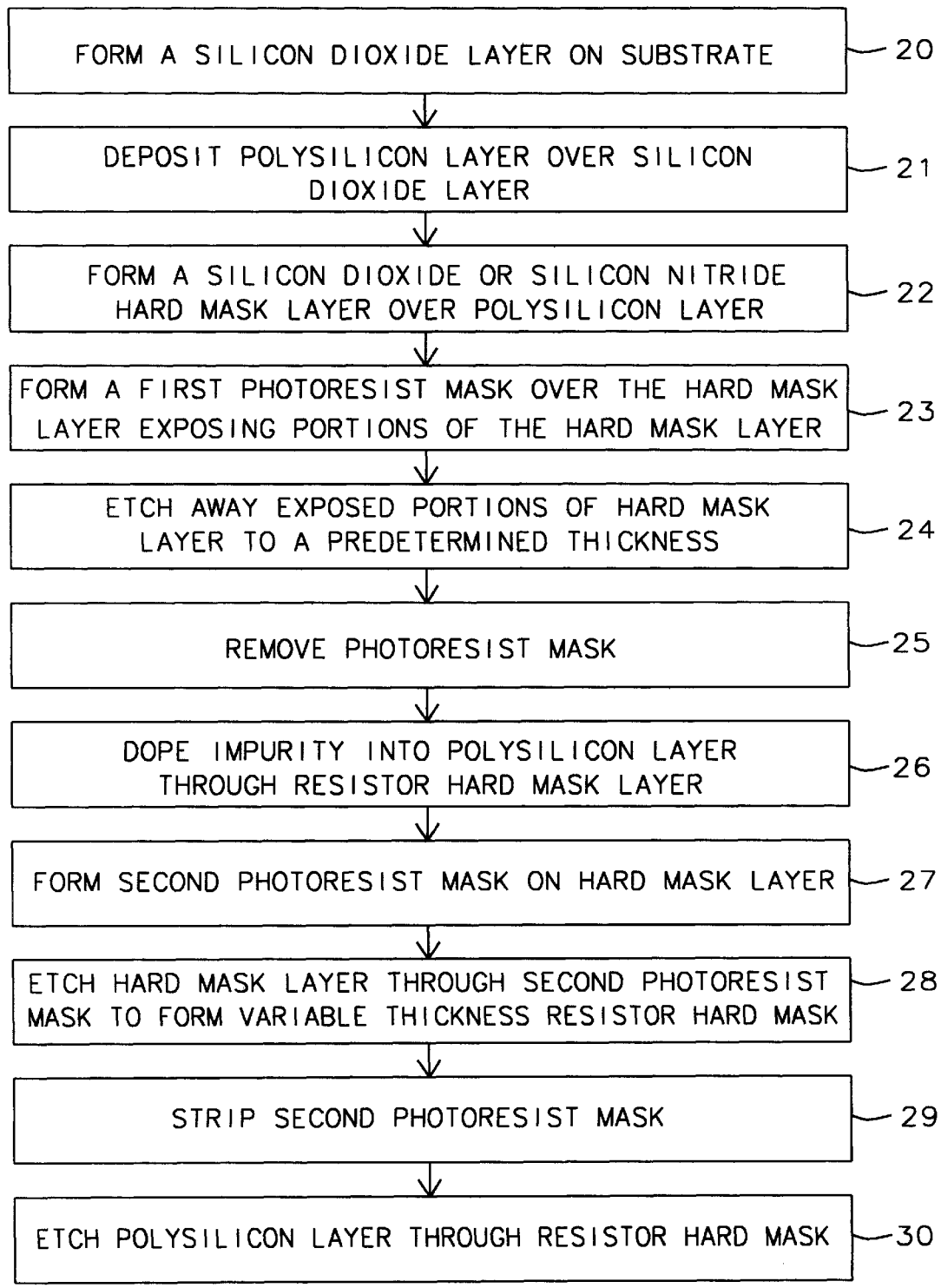
FIG. 1 shows a flow chart of processing steps in accordance with a first embodiment of this invention.
Figure 2A:
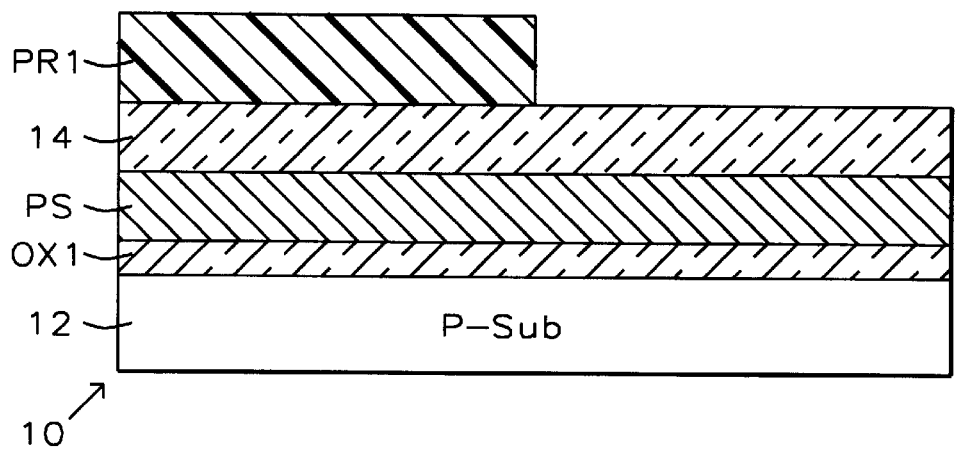
FIGS. 2A–2H illustrate a device in the process of manufacture which forms a single polysilicon layer PS into structures with different resistance values in accordance with the process of FIG. 1.

Referring to FIG. 1 and FIGS. 2A–2H, a method of forming a single polysilicon layer PS into structures with different resistance values, comprises the steps as follows:

(1) Referring to FIG. 1 in step 20, and FIG. 2A an integrated circuit device 10 is made starting with a substrate 12, such as a P-doped substrate. During this first step, the substrate 12 is coated with a silicon dioxide ($SiO_2$) layer OX1 by a CVD process or a thermal process.

This layer can be a gate oxide layer for a gate electrode or can be a field oxide layer for a resistor.

A capacitor plate can be formed over either a field oxide layer or a gate oxide layer.

(2) In step 21 deposit a polysilicon layer PS over the silicon dioxide layer OX1.

(3) In step 22, form a hard mask layer 14 of silicon dioxide ($SiO_2$) or silicon nitride ($Si_3N_4$) on the polysilicon layer PS with a thickness from about 0.3 μm to about 0.5 μm.

(4) Then, in step 23 define a first photoresist mask PR1 over hard mask layer 14 to produce a surface area of the exposed region of the hard mask layer 14 by leaving portions of the hard mask layer exposed, i.e. without protection by first photoresist mask PR1.

Figure 2B:
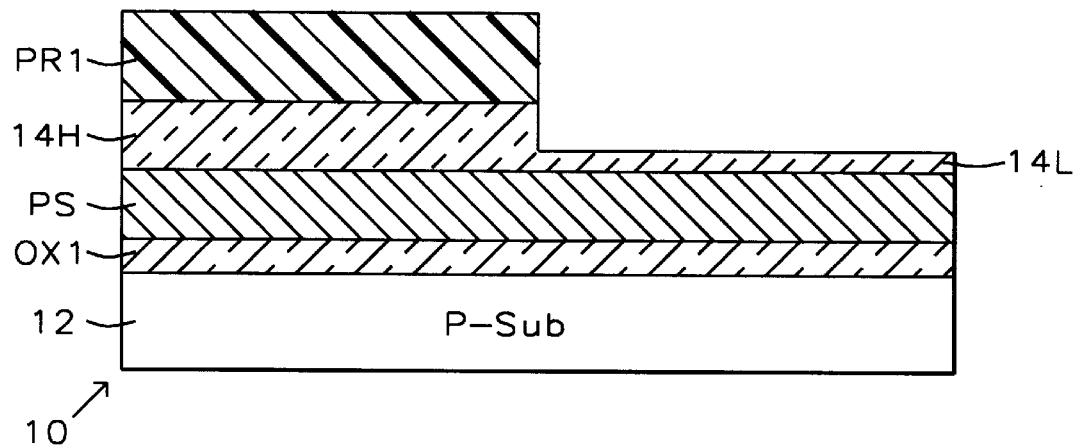

(5) Referring to FIG. 2B, in step 24 of FIG. 1, etch away a substantial thickness of the hard mask layer 14 in the exposed area referred to hereinafter as the "low resistance" thin region 14L which has been reduced to a predetermined thickness from about 0.01 μm to about 0.15 μm in the exposed area referred to hereinafter as thin region 14L.

The remainder of hard mask layer 14 comprises the "high resistance" thick region 14H of polysilicon layer 14 with its original thickness.

Figure 2C:
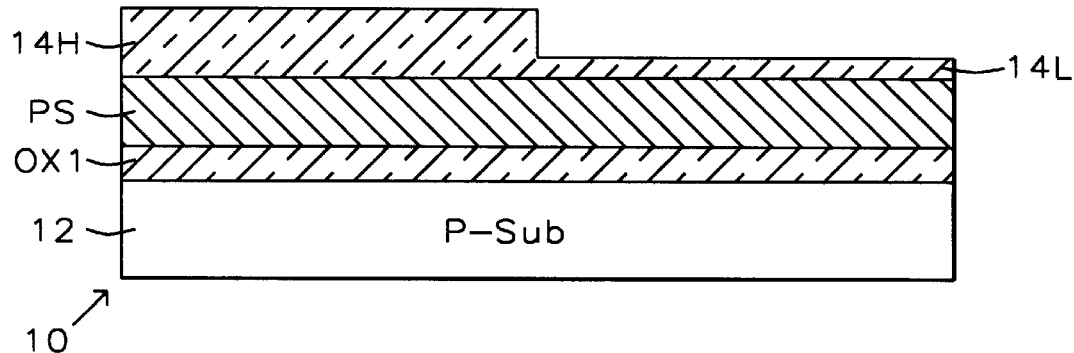

(6) Referring to FIG. 2C, in step 25, remove the photoresist mask PR1 leaving the thick region 14H of hard mask layer 14, as well as thin region 14L, exposed.

Figure 2D:
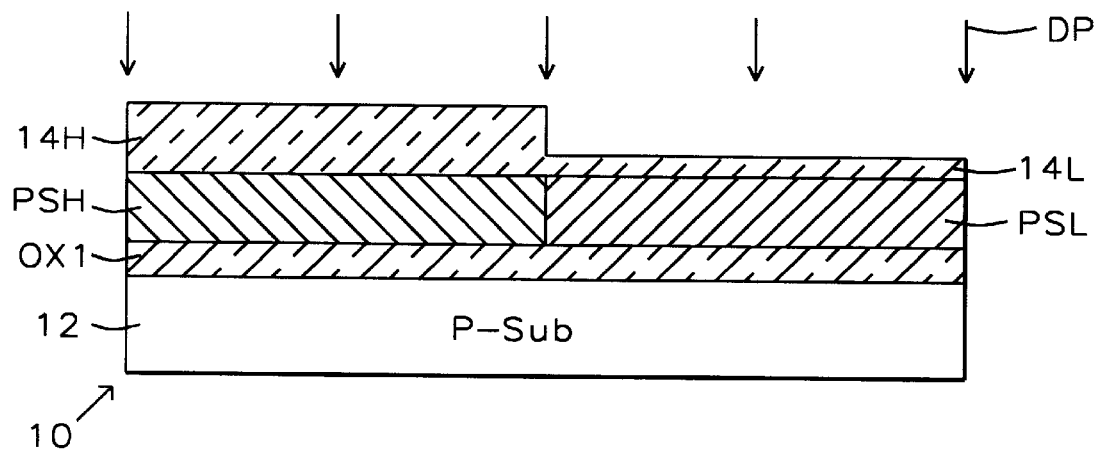

(7) Referring to FIG. 2D, in step 26 dope or ion implant an impurity DP into polysilicon layer PS through hard mask thick region 14H and thin region 14L of silicon dioxide ($SiO_2$) or silicon nitride ($Si_3N_4$) to produce high resistance region PSH of layer PS under thick region 14H and low resistance region PSL of layer PS under thin region 14L.

The doping can be provided by ion implanting with a dose of N type or P type dopant from about 1 E 12 ions/cm$^2$ to about 1 E 15 ions/cm$^2$ at an energy from about 30 keV to about 120 keV.

After annealing the concentration of N-type or P-type dopant in the high resistance region PSH was from about 1 E 12 atoms/cm$^3$ to about 1 E 15 atoms/cm$^3$.

The concentration of N-type or P-type dopant in the low resistance region PSL was from about 1 E 12 atoms/cm$^3$ to about 1 E 15 atoms/cm$^3$.

Figure 2E:
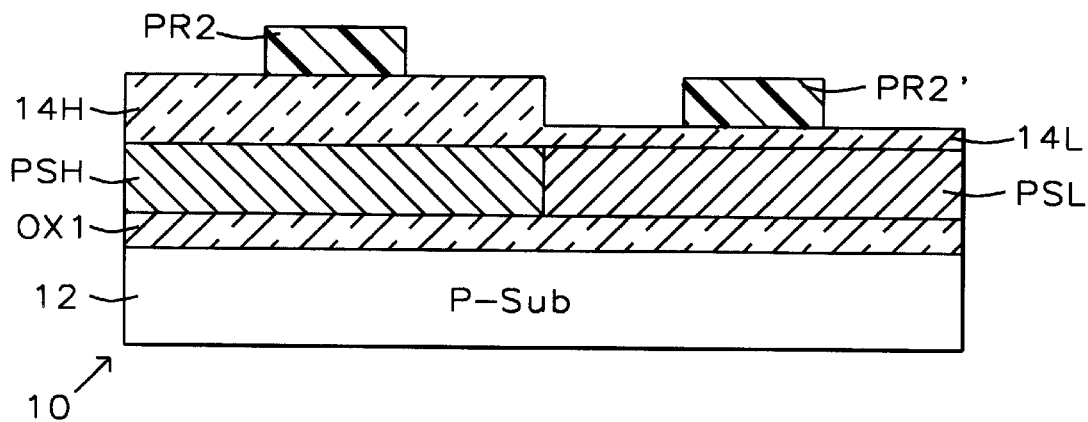

(8) Referring to FIG. 2E, in step 27 form a second mask PR2/PR2' (formed of photoresist) for patterning the hard mask layer thick region 14H and the hard mask thin region 14L (silicon dioxide or silicon nitride) using photolithography and etching only.

Figure 2F:
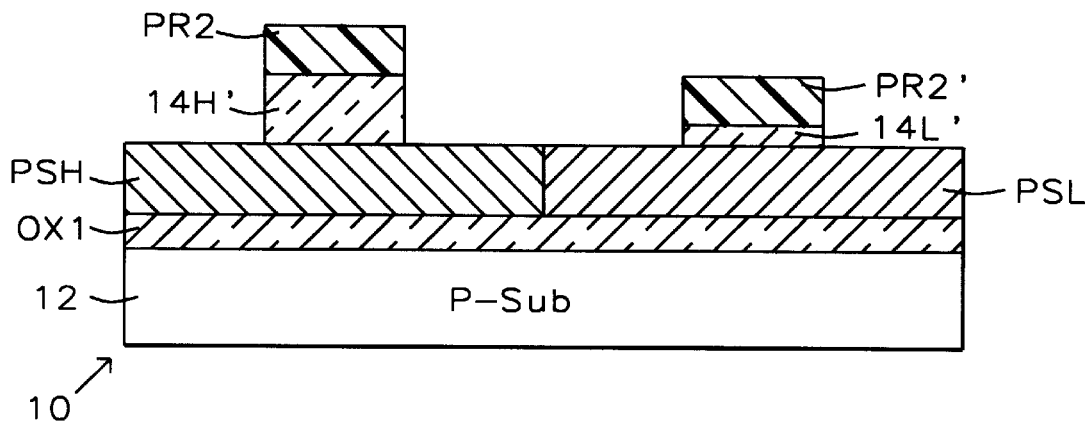

(9) Referring to FIG. 2F, in step 28 hard mask layer 14 was patterned into a separate thick hard mask 14H' under photoresist mask PR2 and into a separate thin hard mask 14L' under photoresist mask PR2'

Figure 2G:
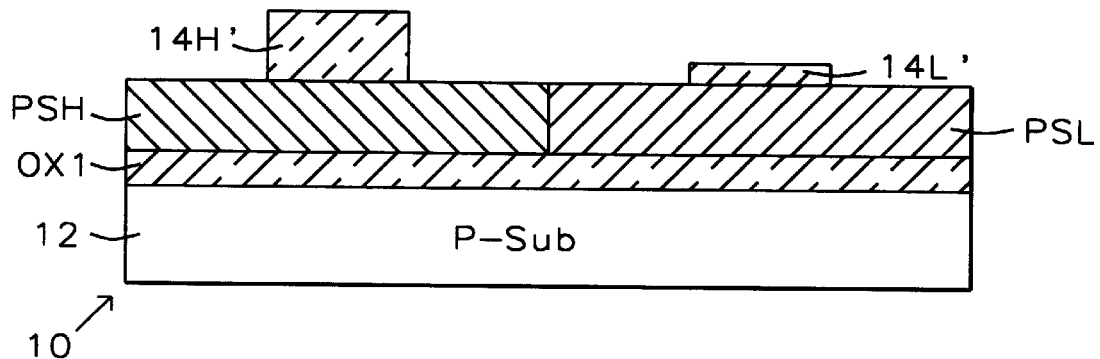

(10) Then, referring to FIG. 2G, in step 29 the photoresist masks PR2/PR2' were stripped from the hard masks 14H' and 14L'.

Figure 2H:
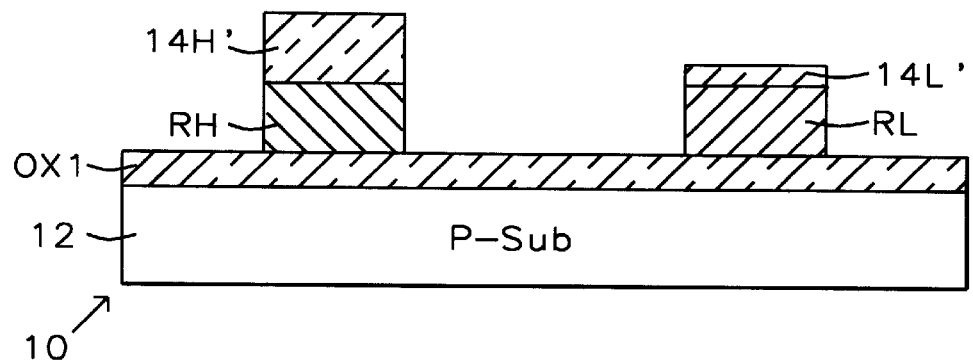

(11) Then, referring to FIG. 2H, in step 30, the thick hard mask 14H' and thin hard mask 14L' were used to pattern polysilicon regions PSH and PSL using highly selective etching to form the high resistance device RH from region PSH, under thick hard mask 14H' and the low resistance device RL from region PSL, under thin hard mask 14L'.

Second Embodiment of the Invention

Figure 3:
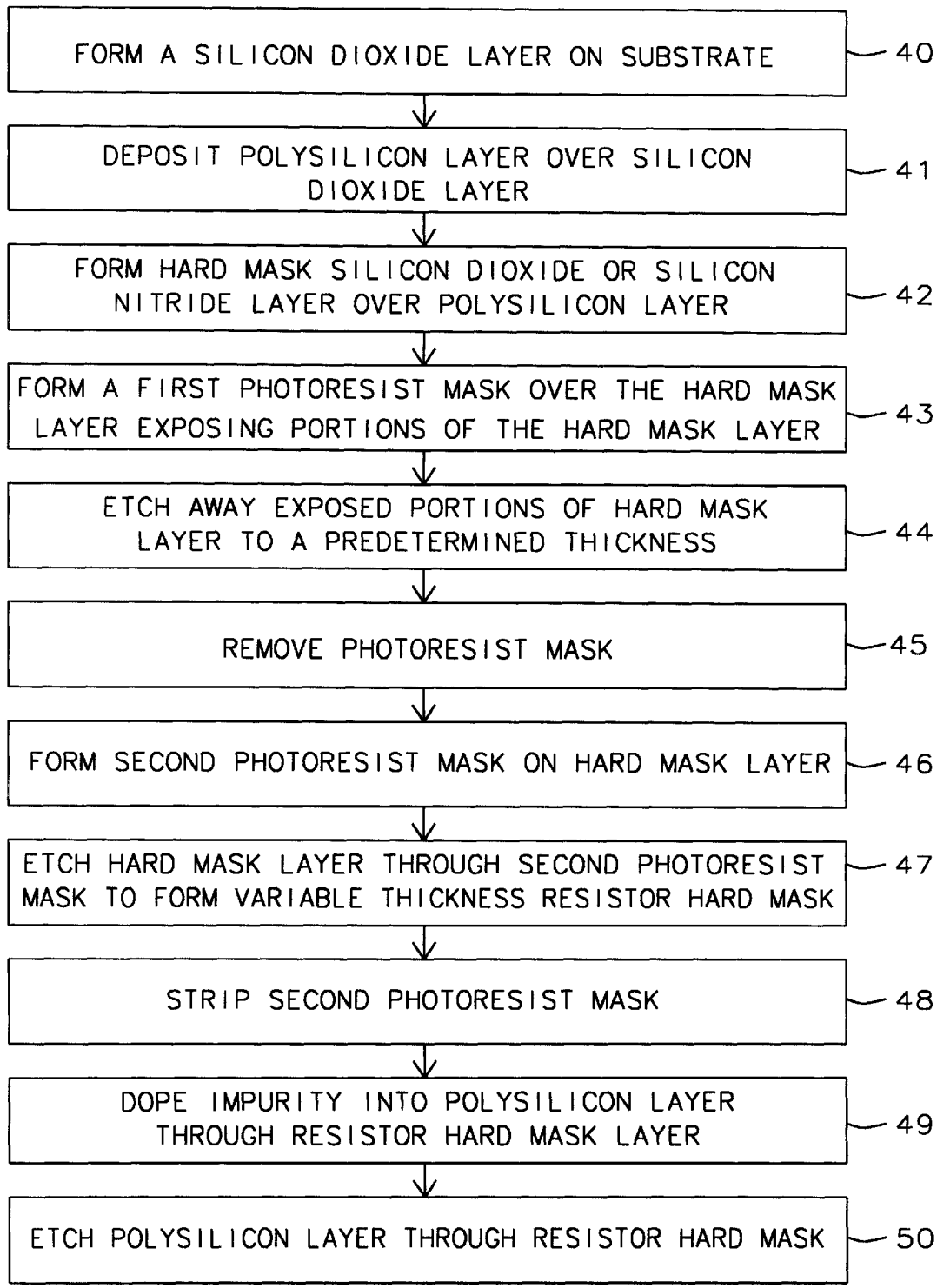
FIG. 3 shows a flow chart of processing steps in accordance with a second embodiment of this invention.
Figure 4A:
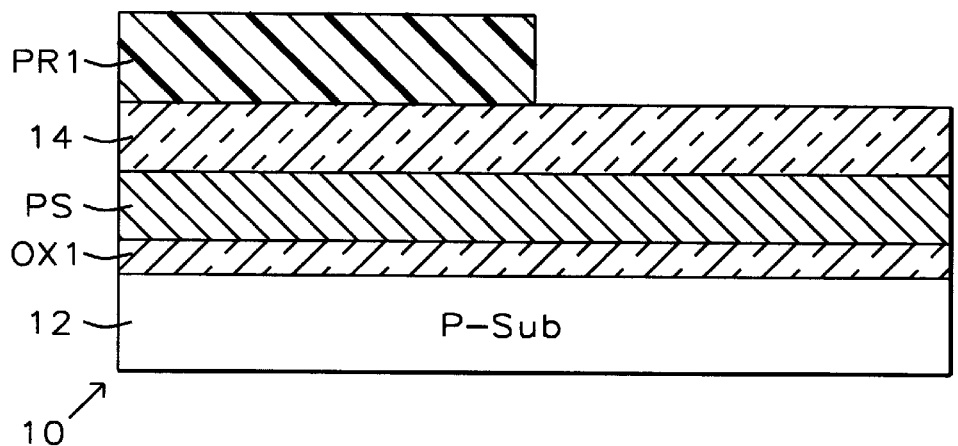
FIGS. 4A–4H illustrate a device in the process of manufacture which forms a single polysilicon layer into structures with different resistance values in accordance with the process of FIG. 3.
Figure 6A:
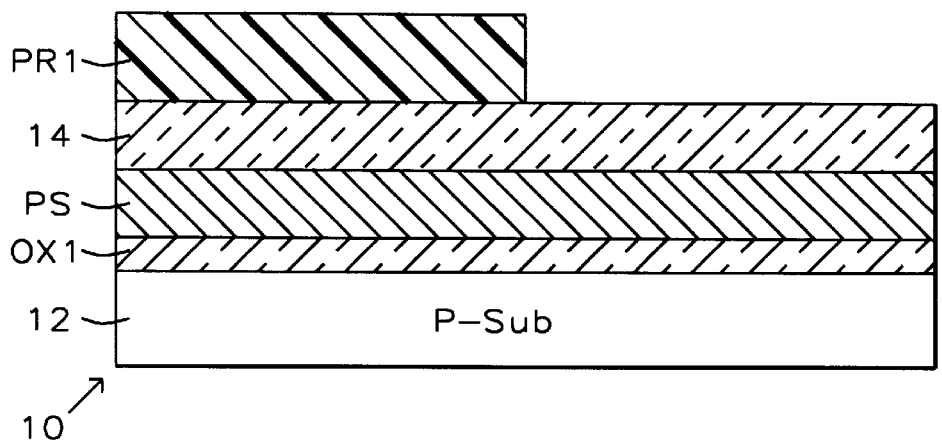
FIGS. 6A–6H illustrate a device in the process of manufacture which forms a single polysilicon layer into structures with different resistance values in accordance with the process of FIG. 5.
Figure 6B:
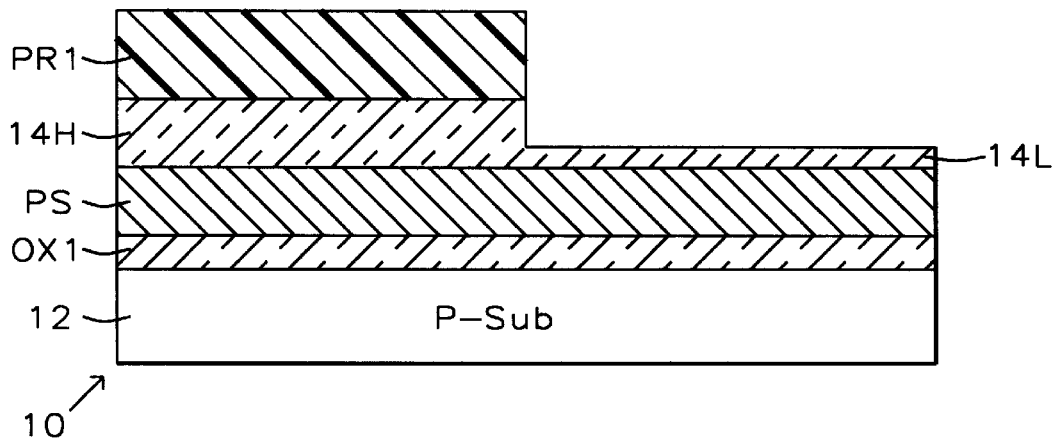
Figure 6C:
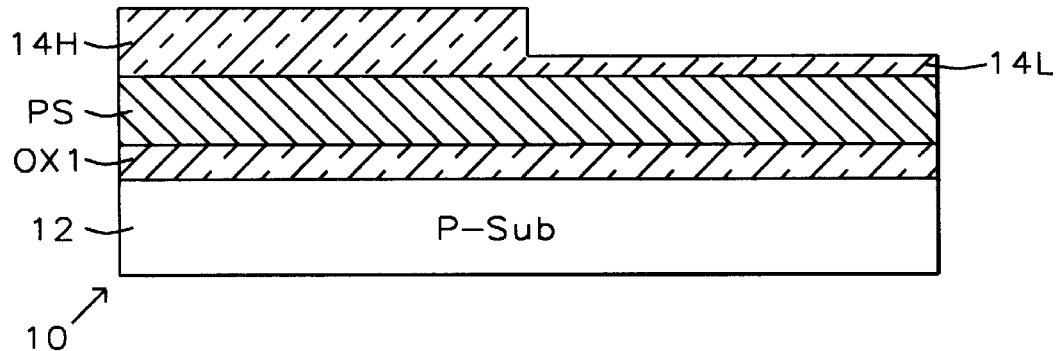
Figure 6D:
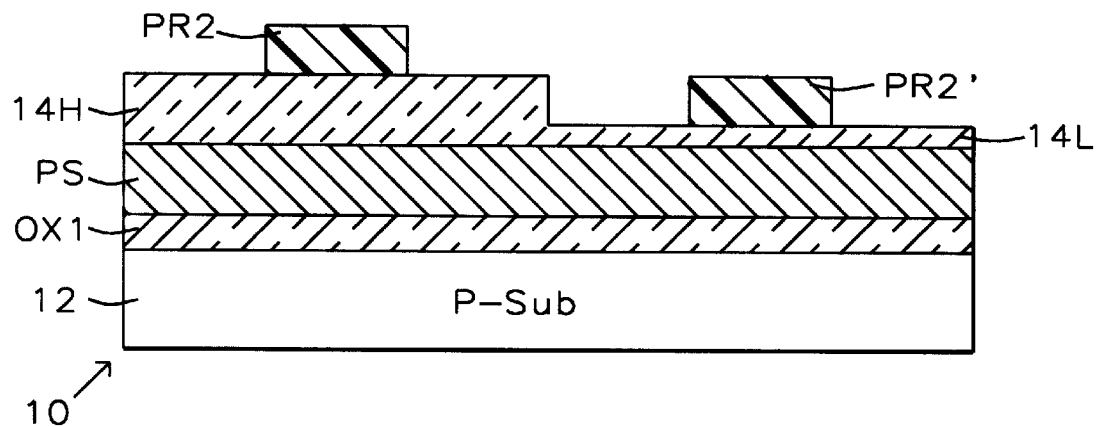
Figure 6E:
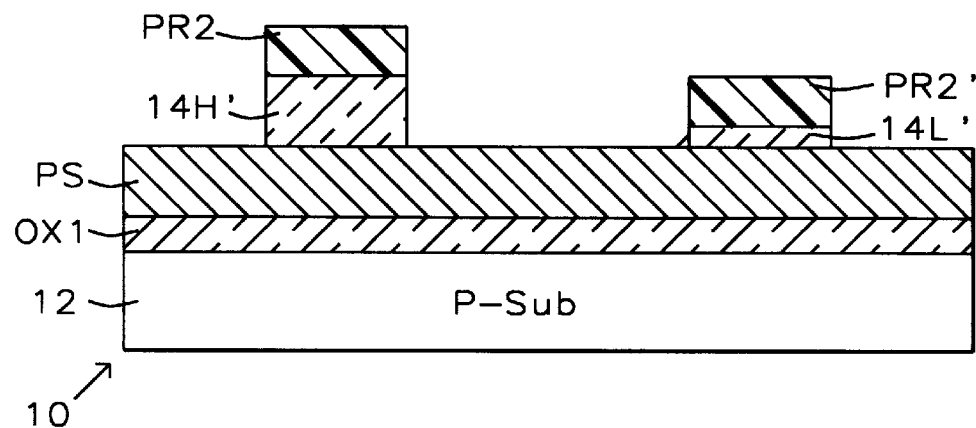
Figure 6F:
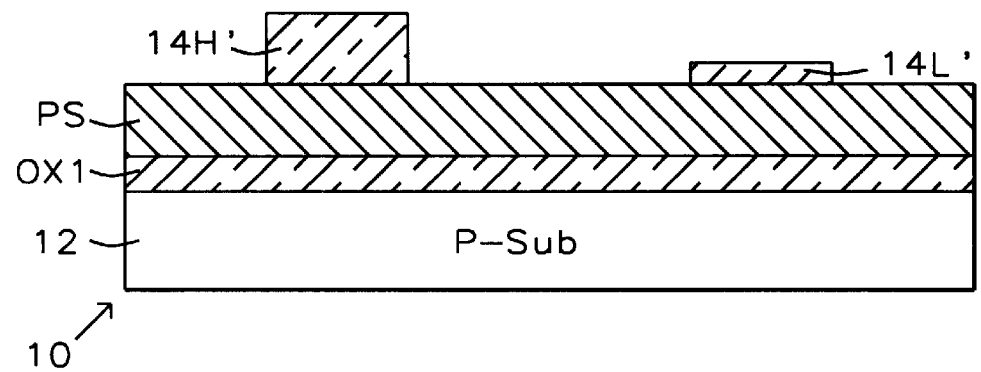
Figure 6G:
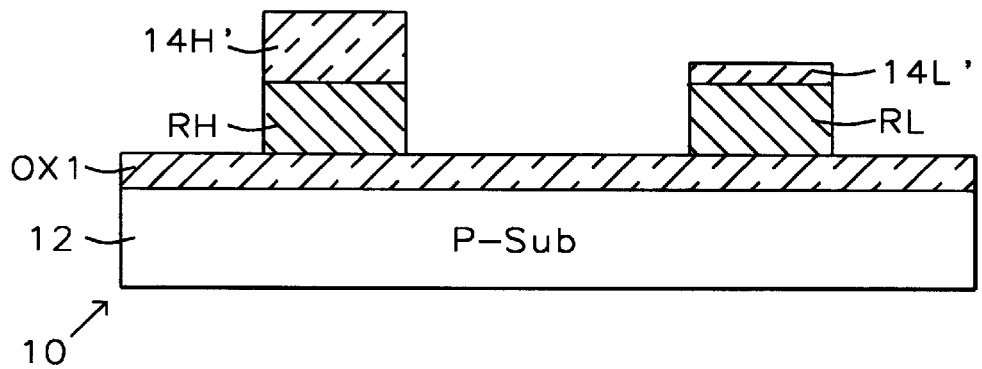
Figure 6H:
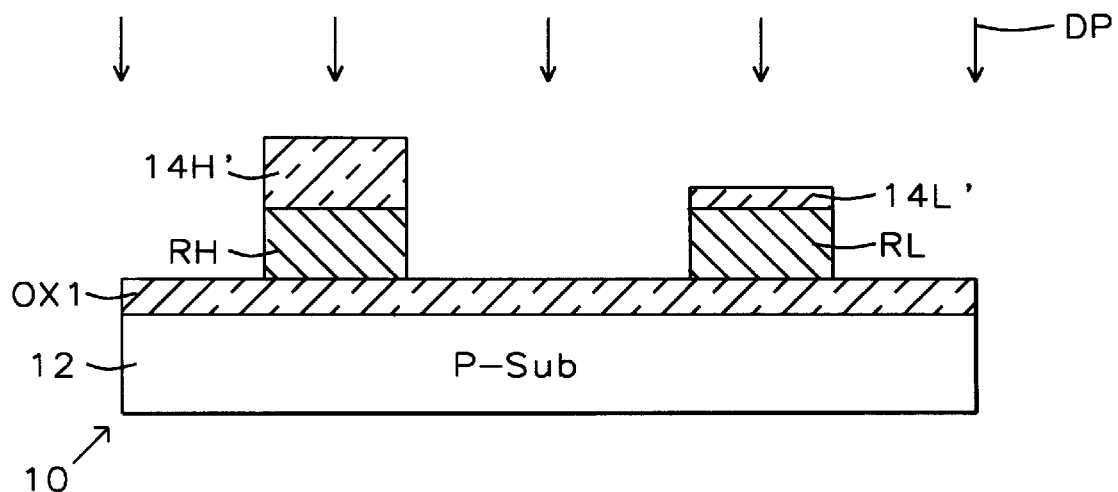

The method of the second embodiment of the invention is similar to the method of the first embodiment except that the steps are as shown in FIGS. 2A–2H with the doping step moved from FIG. 2D in the first embodiment to FIG. 6H in the second embodiment representing a switch in the sequence of processing of the doping step to nearer the end of the process. The method of the second embodiment is as follows:

(1) Referring to FIGS. 3 and 4A the device 10 described above is made by a different sequence of the above steps, starting with step 40 in FIG. 3 with reference to FIG. 4A. The integrated circuit device 10 is made starting with a substrate 12, such as a P-doped substrate. During this first step 40, the substrate 12 is coated with a silicon dioxide ($SiO_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 41 deposit a polysilicon layer PS over silicon dioxide layer OX1.

(3) In step 42, form a hard mask layer 14 of silicon dioxide ($SiO_2$) or silicon nitride ($Si_3N_4$) on the polysilicon layer PS with a thickness from about 0.3 μm to about 0.5 μm.

(4) Then, in step 43 define a first photoresist mask PR1 over layer 14 to produce a surface area of the exposed region of the hard mask layer 14 by leaving it without coverage by first photoresist mask PR1.

Figure 4B:
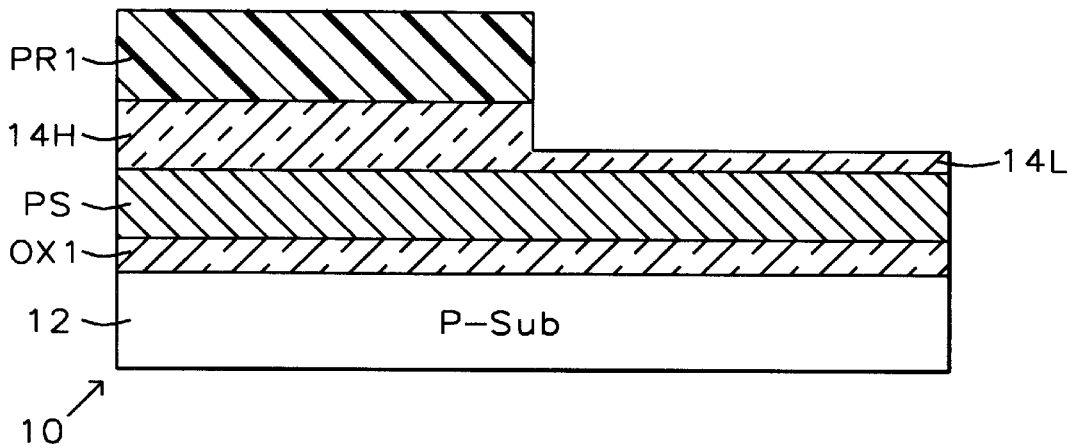

(5) Referring to FIG. 4B, in step 44 of FIG. 3, etch away a substantial thickness of the hard mask layer 14 in the exposed area referred to hereinafter as the "low resistance" thin region 14L which has a reduced, predetermined thickness from about 0.01 μm to about 0.15 μm.

The remainder of hard mask layer 14 comprises the thick, "high resistance" thick region 14H of polysilicon layer 14 with its original thickness.

Figure 4C:
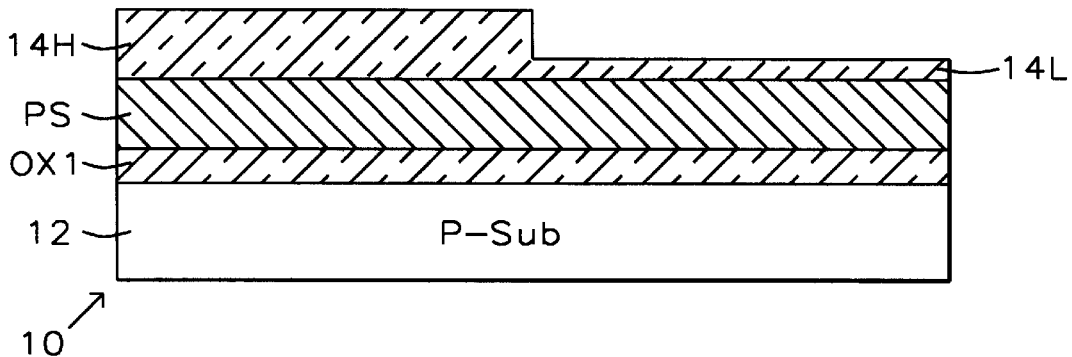

(6) Referring to FIG. 4C, in step 45, remove the photoresist mask PR1 leaving the thick region 14H of hard mask layer 14, as well as thin region 14L, exposed.

Figure 4D:
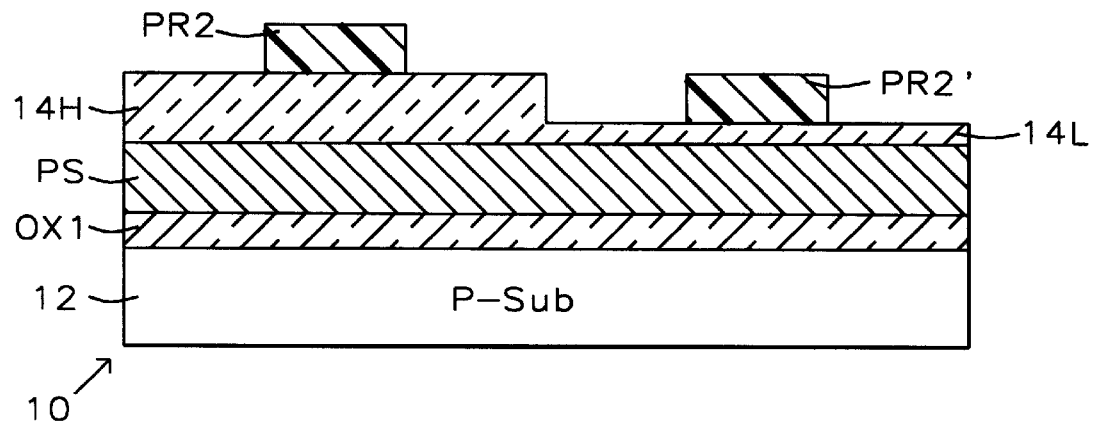

(7) Referring to FIG. 4D, in step 46, form a second mask PR2/PR2' (formed of photoresist) for patterning the hard mask layer thick region 14H and the hard mask thin region 14L (silicon dioxide or silicon nitride) using photolithography and etching only.

Figure 4E:
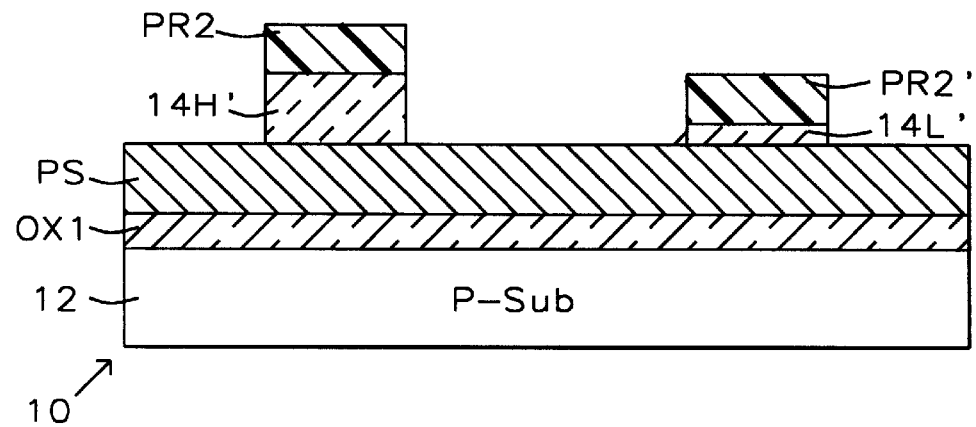

(8) Referring to FIG. 4E, in step 47, hard mask layer 14 has been patterned into separate thick hard mask 14H' under photoresist mask PR2 and thin hard mask 14L' under photoresist mask PR2'.

Figure 4F:
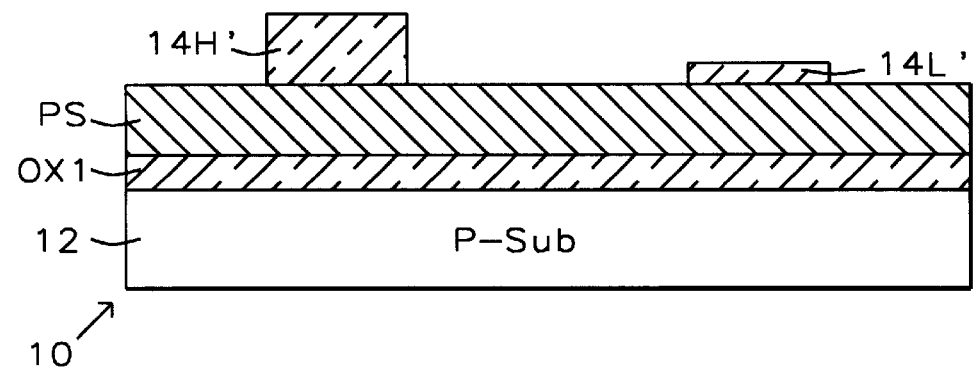

(9) Then, referring to FIG. 4F, in step 48 the photoresist masks PR2/PR2' were stripped from both the thick and the thin hard mask layers 14H' and 14L', respectively.

Figure 4G:
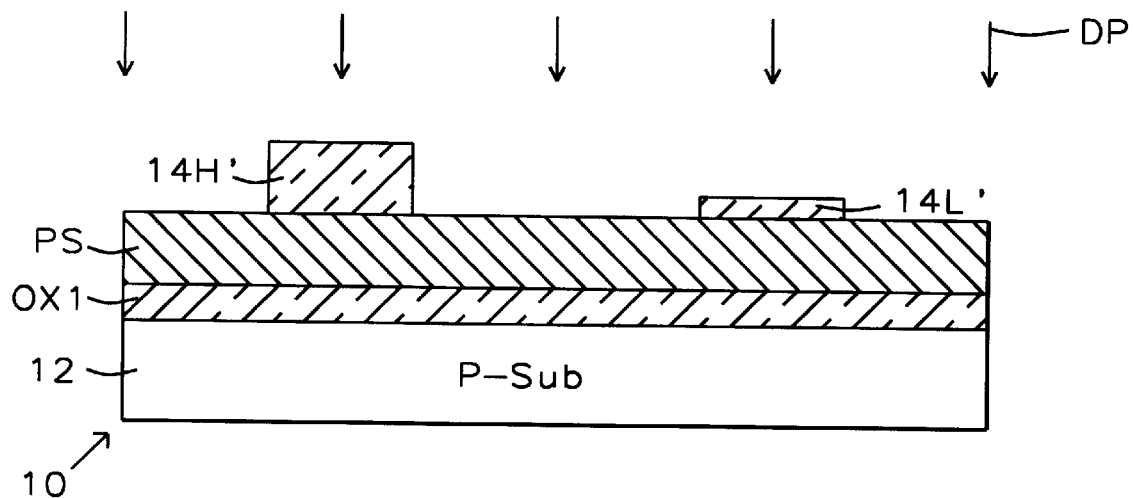

(10) Referring to FIG. 4G, in step 49 dope or ion implant an impurity DP into polysilicon layer PS through hard mask layer 14 of silicon dioxide ($SiO_2$) or silicon nitride ($Si_3N_4$).

The doping can be provided by ion implanting with a dose of N-type or P-type dopant from about $1 E 12$ ions/cm$^2$ to about $1 E 15$ ions/cm$^2$ at an energy from about 30 keV to about 120 keV.

After annealing the concentration of N-type or P-type dopant in the high resistance region RH was from about $1 E 12$ atoms/cm$^3$ to about $1 E 15$ atoms/cm$^3$. The concentration of N-type or P-type dopant in the low resistance region RL was from about $1 E 12$ atoms/cm$^3$ to about $1 E 15$ atoms/cm$^3$.

Figure 4H:
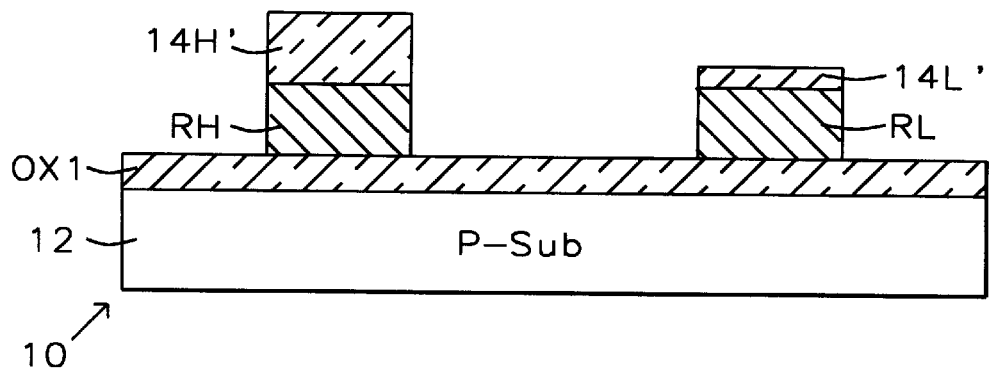

(11) Referring to FIG. 4H, use the thick hard mask 14H' under mask PR2 and thin hard mask 14L' to pattern the polysilicon layer PS into high resistance device RH and low resistance device RL using highly selective etching.

Third Embodiment of the Invention

Figure 5:
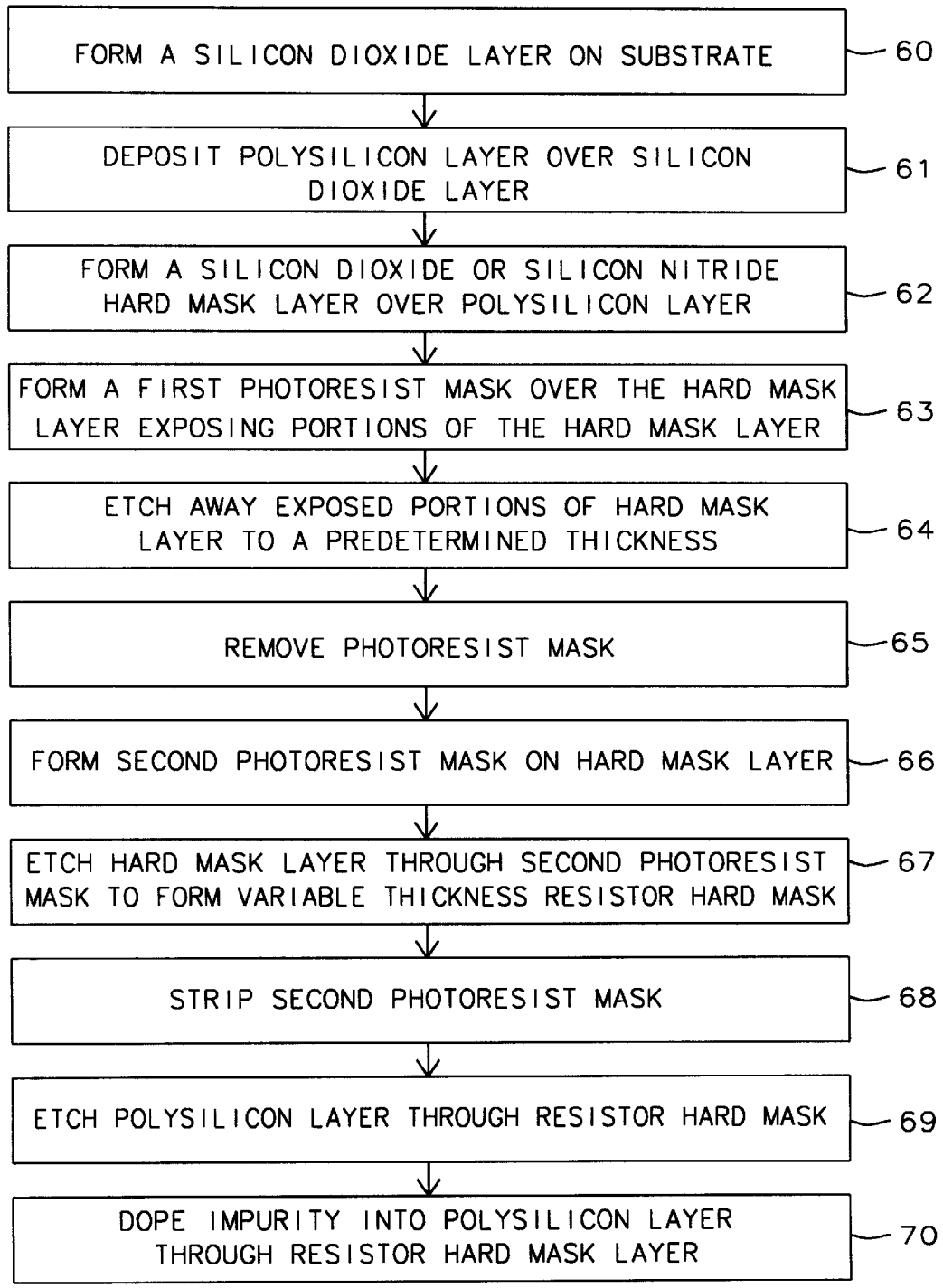
FIG. 5 shows a flow chart of processing steps in accordance with a third embodiment of this invention.

The method of the third embodiment of the invention is similar to the method of the second embodiment except that the steps are as shown in FIGS. 6A–6H with FIGS. 6G and 6H representing a reversal of the processing of the doping step. The method of the third embodiment is as follows:

(1) Referring to FIGS. 5 and 6A, the device 10 described above is made by a different sequence of the above steps, starting with step 60 in FIG. 3 with reference to FIG. 6A. The integrated circuit device 10 is made starting with a substrate 12, such as a P-doped substrate. During this first step 60, the substrate 12 is coated with a silicon dioxide ($SiO_2$) layer OX1 by a CVD process or a thermal process.

This layer can be a gate oxide layer for a gate electrode or can be a field oxide layer for a resistor. A capacitor plate can be formed over either a field oxide layer or a gate oxide layer.

(2) In step 61 deposit a polysilicon layer PS over silicon dioxide layer OX1.

(3) In step 62, form a hard mask layer 14 of silicon dioxide ($SiO_2$) or silicon nitride ($Si_3N_4$) on the polysilicon layer PS with a thickness from about 0.3 μm to about 0.5 μm.

(4) Then, in step 63 define a first photoresist mask PR1 over layer 14 to produce a surface area of the exposed region of the hard mask layer 14 by leaving it without coverage by first photoresist mask PR1.

(5) Referring to FIG. 6B, in step 64 of FIG. 5, etch away a substantial thickness of the hard mask layer 14 leaving an exposed area referred to hereinafter as the "low resistance" thin region 14L which has a reduced, predetermined thickness, from about 0.01 μm to about 0.15 μm.

The remainder of hard mask layer 14 comprises the thick, "high resistance" region 14H of polysilicon layer 14 with its original thickness.

(6) Referring to FIG. 6C, in step 65, remove the photoresist mask PR1 leaving the thick region 14H of hard mask layer 14, as well as thin region 14L, exposed.

(7) Referring to FIG. 6D, in step 66, form a second mask PR2/PR2' (formed of photoresist) for patterning the hard mask layer thick region 14H and the hard mask thin region 14L (silicon dioxide or silicon nitride) using photolithography and etching only.

(8) Referring to FIG. 6E, in step 67, hard mask layer 14 has been patterned into a separate thick hard mask 14H' under photoresist mask PR2 and into a separate thin hard mask 14L' under photoresist mask PR2'.

(9) Then, referring to FIG. 6F, in step 68 the photoresist masks PR2/PR2' were stripped from both the thick and the thin hard mask layers 14H' and 14L', respectively.

At this point the process diverges from FIG. 4G and 4H to the steps as illustrated by FIGS. 6G and 6H.

(10) Referring to FIG. 6G, in step 69, use the thick hard mask 14H' under mask PR2 and thin hard mask 14L' to pattern the polysilicon layer PS into high resistance device RH and low resistance device RL using highly selective etching.

(11) Referring to FIG. 6H, in step 70, dope or ion implant an impurity DP into polysilicon layer PS through hard mask layer 14 of silicon dioxide ($SiO_2$) or silicon nitride ($Si_3N_4$).

The doping of the polysilicon layer can be provided by ion implanting with a dose of N-type or P-type dopant from about $1 E 12$ ions/cm$^2$ to about $1 E 15$ ions/cm$^2$ at an energy from about 30 keV to about 120 keV.

After annealing the concentration of N-type or P-type dopant in the high resistance region RH was from about $1 E 12$ atoms/cm$^3$ to about $1 E 15$ atoms/cm$^3$. The concentration of N-type or P-type dopant in the low resistance region RL was from about $1 E 12$ atoms/cm$^3$ to about $1 E 15$ atoms/cm$^3$.

In summary, the three embodiments described above provide as follows:

1. Doping polysilicon after etching the hard mask pattern to variable thicknesses.
2. Etching the hard mask pattern to variable thicknesses followed by patterning the hard mask and then patterning the polysilicon and doping after using the hard mask in step 10.

3. Etching the hard mask pattern to variable thickesses followed by patterning the hard mask and patterning the polysilicon followed by doping of the polysilicon in step 11.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming a plurality of structures with different resistance values from a single polysilicon layer comprising:

(a) forming a polysilicon layer upon a substrate,
   (b) forming a hard masking layer upon said polysilicon layer with an original thickness,
   (c) masking said hard masking layer with a first mask having an opening therethrough to expose a portion of said hard masking layer which is to be partially etched away to form a reduced thickness portion of said hard masking layer,
   (d) etching through said opening to etch partially through said hard masking layer to produce a reduced thickness thereof below said opening in said mask while leaving the remainder of said hard masking layer with said original thickness,
   (e) removing said first mask, subsequent of removing said first mask performing the steps as follows:

(f) patterning said polysilicon layer by the steps comprising:
      (1) forming a second mask with openings through said second mask over said hard mask layer,
      (2) etching away exposed portions of said hard mask layer through said openings through said second mask down to said polysilicon layer thereby providing a patterned hard mask layer and exposing portions of said polysilicon layer below said openings through said second mask,
      (3) stripping away said second mask leaving said patterned hard mask layer with said portions of said polysilicon layer exposed aside from said hard mask layer,
      (4) etching away exposed portions of said polysilicon layer, and
   (g) subsequent to step (f) performing the step of doping said polysilicon layer through said hard masking layer with variable doping as a function of said reduced thickness and said original thickness of said hard masking layer.

2. The method of claim 1 wherein said hard masking layer is composed of a material selected from the group consisting of silicon oxide and silicon nitride.

3. The method of claim 1 wherein a patterning mask is formed over said hard masking layer after doping of said polysilicon layer.

4. The method of claim 1 wherein a patterning mask is formed over said hard masking layer before doping of said polysilicon layer.

5. The method of claim 1 wherein:
   a patterning mask is formed over said hard masking layer after doping of said polysilicon layer, and
   then said hard mask and said polysilicon layer are patterned by said patterning mask.

6. The method of claim 1 wherein:
   a patterning mask is formed over said hard masking layer before doping of said polysilicon layer, and
   then said then said hard mask and said polysilicon layer are patterned by said patterning mask, before doping of said polysilicon layer.

7. The method of claim 1 wherein:
   said hard masking layer is composed of a material selected from the group consisting of silicon oxide and silicon nitride, and
   a patterning mask is formed over said hard masking layer before doping of said polysilicon layer.

8. The method of claim 7 wherein:
   said original thickness portion is from 0.3 $\mu$m to 0.5 $\mu$m thick, and said reduced thickness portion is from 0.01 $\mu$m to 0.15 $\mu$m thick.

9. The method of claim 1 wherein:
   said hard masking layer is composed of a material selected from the group consisting of silicon oxide and silicon nitride,
   a patterning mask is formed over said hard masking layer after doping of said polysilicon layer, and
   then said hard mask and said polysilicon layer are patterned by said patterning mask.

10. The method of claim 9 wherein:
    said original thickness portion is from 0.3 $\mu$m to 0.5 $\mu$m thick, and said reduced thickness portion is from 0.01 $\mu$m to 0.15 $\mu$m thick.

11. The method of claim 1 wherein:
    said hard masking layer is composed of a material selected from the group consisting of silicon oxide and silicon nitride,
    a patterning mask is formed over said hard masking layer before doping of said polysilicon layer, and
    then said hard mask and said polysilicon layer are patterned by said patterning mask before doping.

12. The method of claim 11 wherein:
    said original thickness portion is from 0.3 $\mu$m to 0.5 $\mu$m thick, and
    said reduced thickness portion is from 0.01 $\mu$m to 0.15 $\mu$m thick.

13. The method of claim 1 wherein:
    said hard masking layer is composed of a material selected from the group consisting of silicon oxide and silicon nitride,
    a patterning mask is formed over said hard masking layer before doping of said polysilicon layer, and
    then said hard mask and said polysilicon layer are patterned by said patterning mask after doping.

14. The method of claim 13 wherein:
    said original thickness portion is from 0.3 $\mu$m to 0.5 $\mu$m thick, and
    said reduced thickness portion is from 0.01 $\mu$m to 0.15 $\mu$m thick.

15. The method of claim 1 wherein:
    said original thickness portion is from 0.3 $\mu$m to 0.5 $\mu$m thick, and said reduced thickness portion is from 0.01 $\mu$m to 0.15 $\mu$m thick.

16. A method of forming a plurality of structures with different resistance values from a single polysilicon layer comprising:

(a) forming a polysilicon layer upon a substrate, (b) forming a hard masking layer upon said polysilicon layer with an original thickness, (c) masking said hard masking layer with a first photoresist mask having an opening therethrough to expose a portion of said hard masking layer which is to be partially etched away to form a reduced thickness portion of said hard masking layer, said hard masking layer being composed of a material selected from the group consisting of silicon oxide and silicon nitride, (d) etching through said opening in said first photoresist mask to etch partially through said hard masking layer to produce a reduced thickness thereof below said opening in said mask while leaving the remainder of said hard masking layer with said original thickness, (e) removing said first mask, subsequent to removing said first photoresist mask performing the steps as follows:

(f) patterning said polysilicon layer by the steps comprising:

(1) forming a second photoresist mask with openings through said second photoresist mask over said hard mask layer, (2) etching away exposed portions of said hard mask layer through said openings through said second photoresist mask down to said polysilicon layer thereby providing a patterned hard mask layer and exposing portions of said polysilicon layer below said openings through said second photoresist mask, (3) stripping away said second mask leaving said patterned hard mask layer with said portions of said polysilicon layer exposed aside from said hard mask layer, (4) etching away exposed portions of said polysilicon layer, and (g) subsequent to step (f) performing the step of doping said polysilicon layer through said hard masking layer with variable doping as a function of said reduced thickness and said original thickness of said hard masking layer.

17. A method of forming a plurality of structures with different resistance values from a single polysilicon layer comprising:

(a) forming a polysilicon layer upon a substrate, (b) forming a hard masking layer upon said polysilicon layer with an original thickness, (c) masking said hard masking layer with a first photoresist mask having an opening therethrough to expose a portion of said hard masking layer which is to be partially etched away to form a reduced thickness portion of said hard masking layer, (d) etching through said opening in said first photoresist mask to etch partially through said hard masking layer to produce a reduced thickness thereof below said opening in said mask while leaving the remainder of said hard masking layer with said original thickness, said original thickness portion is from 0.3 $\mu$m to 0.5 $\mu$m thick, and said reduced thickness portion is from 0.01 $\mu$m to 0.15 $\mu$m thick, (e) removing said first photoresist mask, subsequent to removing said first mask performing the steps as follows:

(f) patterning said polysilicon layer by the steps comprising:

(1) forming a second photoresist mask with openings through said second photoresist mask over said hard mask layer, (2) etching away exposed portions of said hard mask layer through said openings through said second photoresist mask down to said polysilicon layer thereby providing a patterned hard mask layer and exposing portions of said polysilicon layer below said openings through said second photoresist mask, (3) stripping away said second photoresist mask leaving said patterned hard mask layer with said portions of said polysilicon layer exposed aside from said hard mask layer, (4) etching away exposed portions of said polysilicon layer, and (g) subsequent to step (f) performing the step of doping said polysilicon layer through said hard masking layer with variable doping as a function of said reduced thickness and said original thickness of said hard masking layer.

18. The method of claim 17 wherein:

a patterning mask is formed over said hard masking layer before doping of said polysilicon layer.

19. The method of claim 17 wherein:

a patterning mask is formed over said hard masking layer after doping of said polysilicon layer, and then said hard mask and said polysilicon layer are patterned by said patterning mask.

* * * * *